United States Patent [19]
Taylor

[11] Patent Number: 5,644,255
[45] Date of Patent: Jul. 1, 1997

[54] CIRCUITS SYSTEMS AND METHODS FOR REDUCING POWER LOSS DURING TRANSFER OF DATA ACROSS A CONDUCTIVE LINE

[75] Inventor: Ronald T. Taylor, Grapevine, Tex.

[73] Assignee: Cirrus Logic, Inc., Fremont, Calif.

[21] Appl. No.: 620,115

[22] Filed: Mar. 21, 1996

Related U.S. Application Data

[63] Continuation-in-part of Ser. No. 543,210, Oct. 13, 1995, Pat. No. 5,585,744.

[51] Int. Cl.$^6$ ................................................ H03K 19/017
[52] U.S. Cl. .................... 326/81; 326/30; 326/33; 326/86
[58] Field of Search ........................... 326/21, 30, 31, 326/33, 34, 80, 81, 86, 121; 375/76

[56] References Cited

U.S. PATENT DOCUMENTS

| | | | |
|---|---|---|---|
| 3,906,254 | 9/1975 | Lane et al. | 307/205 |
| 4,039,862 | 8/1977 | Dingwall | 307/247 |
| 4,450,371 | 5/1984 | Bismarck | 306/264 |
| 4,486,670 | 12/1984 | Chan et al. | 307/264 |
| 4,730,131 | 3/1988 | Sauer | 307/443 |
| 4,791,321 | 12/1988 | Tanaka et al. | 307/451 |
| 4,914,318 | 4/1990 | Allen | 307/272.2 |
| 4,943,740 | 7/1990 | Glczynski | 307/443 |
| 4,978,870 | 12/1990 | Chen et al. | 307/475 |
| 5,019,728 | 5/1991 | Sanwo et al. | 326/30 X |
| 5,023,488 | 6/1991 | Gunning | 307/475 |
| 5,045,730 | 9/1991 | Cooperman | 307/475 |
| 5,220,211 | 6/1993 | Christopher et al. | 326/30 X |
| 5,285,115 | 2/1994 | Tsuji | 307/362 |
| 5,311,083 | 5/1994 | Wanlass | 326/30 X |
| 5,329,171 | 7/1994 | Shimizu et al. | 307/354 |
| 5,369,319 | 11/1994 | Good et al. | 327/73 |
| 5,399,913 | 3/1995 | Widener et al. | 327/108 |
| 5,469,082 | 11/1995 | Bulhiger et al. | 326/81 |
| 5,469,085 | 11/1995 | Shibata et al. | 326/36 X |

*Primary Examiner*—David R. Hudspeth
*Attorney, Agent, or Firm*—Winstead Sechrest & Minick, P.C.

[57] ABSTRACT

A system 600 is provided having a line driver 202 for transmitting signals across a line 201 from a first processing circuit 601 to a second processing circuit 602. Line driver 202 receives an input signal from processing circuit 601 having a first voltage swing between a first high voltage level and a first low voltage level. Line driver 202 reduces power dissipation in line 201 by transmitting an output signal on line 201 having a second voltage swing between a second low voltage level greater than the first low voltage level and a second high voltage level less than the first high voltage level. System 600 also contains comparator 610 which receives the signal having the reduced second voltage swing and compares the received signal to a reference voltage. The output of comparator 610 restores the received signal to the full voltage swing of the input signal received by line driver 202 and transfers the restored signal to processing circuit 602.

21 Claims, 3 Drawing Sheets

5,644,255

CIRCUITS SYSTEMS AND METHODS FOR REDUCING POWER LOSS DURING TRANSFER OF DATA ACROSS A CONDUCTIVE LINE

CROSS-REFERENCE TO RELATED APPLICATIONS

This application for patent is a continuation-in-part of CIRCUITS, SYSTEMS AND METHODS FOR REDUCING POWER LOSS DURING TRANSFER OF DATA ACROSS A CONDUCTIVE LINE, U.S. patent application Ser. No. 08/543,210 (Attorney Docket No. 2836-P031US), filed on Oct. 13, 1995, now U.S. Pat. No. 5,585,744.

TECHNICAL FIELD OF THE INVENTION

The present invention relates in general to electronic circuits and systems and, in particular, to circuits, systems and methods for reducing power loss during transfer of data across a conductive line.

BACKGROUND OF THE INVENTION

In designing high performance integrated circuits, the need to transfer addresses and data across a bus at high speed is a critical consideration. This is especially true in applications where a memory and a high performance state machine are being integrated into a single chip. One such instance is the bus between a display controller and a frame buffer memory. In this case, substantial amounts of data, and the corresponding addresses, must be transferred between the graphics controller and the frame buffer at rates high enough to support display refresh and update, and other processing operations, such as filtering. As display systems with increased resolution and bit depths are developed, the rate at which data must be transferred between the controller and the frame buffer consequently increases. While some of the necessary bandwidth can be achieved by using wider buses, improvement in the speed at which data is transferred over the individual bus lines is still required.

The lines of a typical on-chip bus or PC board bus are long, thin conductors which extend relatively substantial lengths across the face of an insulating substrate, the substrate spacing each conductor from a ground plane and form other signal wires. As a result of this configuration, each line presents a significant capacitance which must be charged or discharged by a bus driver or similar circuit during data transmission. The result is substantial power consumption, particularly when a CMOS or TTL bus is driven between positive and negative power supply rails.

The power consumption resulting from parasitic bus line capacitance increases directly with the data transmission rate across the bus, since $P=CV^2f$, where P is the power loss through each conductor, V is the voltage applied, C is the capacitance of the conductor, and f is the frequency at which the conductor is charged/discharged. It should also be noted that some additional small power consumption results from the resistance of each bus line.

It is possible to reduce power consumption by reducing the capacitance of the bus lines themselves. This option, however, requires that the fabrication process for chips and for circuit boards be modified; a change in process to reduce line capacitance is expensive and may adversely effect the fabrication of other circuitry on chips and boards. Another option is to reduce the frequency at which data is transferred across the bus. Assuming that the width of the bus is not increased, this option simply trades off system performance for power reduction, an option which usually is not viable in the design and implementation of high performance circuits.

Thus, the need has arisen for improved circuits, systems and methods for transferring data and/or addresses across the lines of a bus at high rates. Such circuits, systems and methods should advantageously minimize power consumption and the problems attendant therewith. In particular, such circuits, systems and methods should be applicable to high performance integrated circuit applications, such as display controllers and semiconductor memories. Finally, such circuits, systems and methods should require neither expensive and complicated changes to the chip fabrication process nor a reduction in system performance for implementation.

SUMMARY OF THE INVENTION

According to one embodiment of the present invention, a system is provided for transferring a signal across a line. The system comprises first circuitry for transmitting the signal across the line, the first circuitry comprising circuitry for generating a first signal having a first voltage swing between a first high voltage level and a first low voltage level, and a line driver for receiving the first signal and outputting a second signal on the line having a second voltage swing between a second high voltage level less than the first high voltage level and a second low voltage level greater than the first low voltage level. The system further comprises second circuitry for receiving the second signal transmitted at the second voltage swing, the second circuitry comprising a comparator, wherein a first input of the comparator is coupled to the line and a second input of the comparator is coupled to a reference voltage greater than the second low voltage level and less than the second high voltage level. The comparator outputs a third signal at substantially the first voltage swing.

The principles of the present invention are further embodied in an integrated circuit having at least some circuitry operating between a preselected supply voltage and a low voltage rail. The integrated circuit comprises a first block of processing circuitry; a second block of processing circuitry; a bus having a line for transferring signals between the blocks of processing circuitry; and a line driver for transmitting signals across the line, the line driver receiving an input signal with a first voltage swing between a first high voltage level substantially equal to the preselected supply voltage and a first low voltage level substantially equal to the low voltage rail and driving the line with a second voltage swing between a second high voltage level less than the first high voltage level and a second low voltage level greater than the first low voltage level. The integrated circuit further comprises a comparator for receiving the second signal transmitted at the second voltage swing, wherein a first input of the comparator is coupled to the line and a second input of the comparator is coupled to a reference voltage greater than the second low voltage level and less than the second high voltage level, the comparator outputting a third signal at substantially the first voltage swing.

The foregoing has outlined rather broadly the features and technical advantages of the present invention in order that the detailed description of the line driver circuit that follows may be better understood. Additional features and advantages of the line driver circuit will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts. For purposes of illustration, the principles of the present invention will be described as if implemented in a display system frame buffer, although these principles may be applied to a number of different data processing circuits and systems, as will become apparent from the discussion below.

Figure 1:
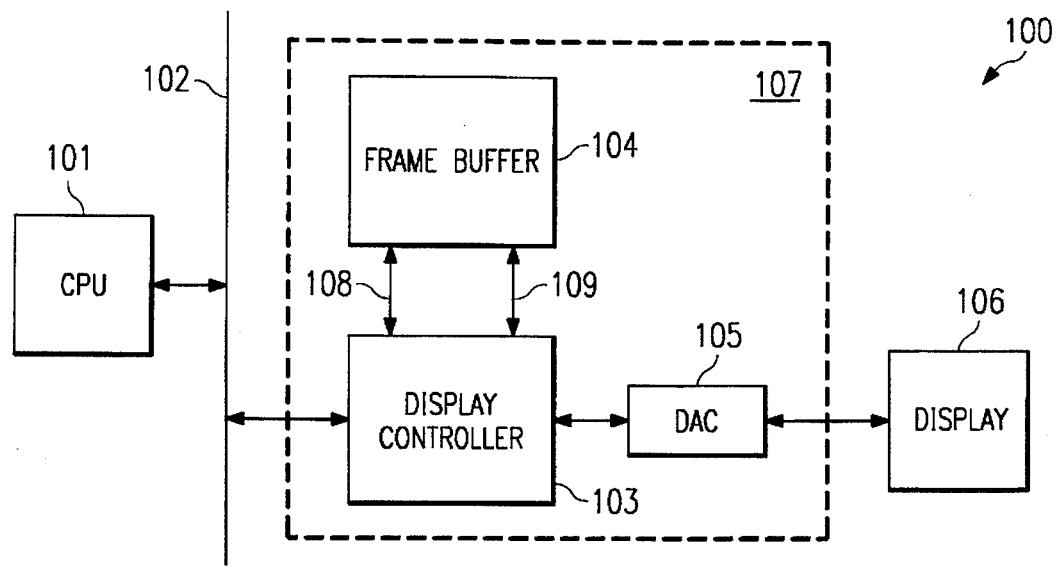
FIG. 1 is a functional block diagram of a display control system.

FIG. 1 is a high level functional block diagram of the portion of a processing system 100 controlling the display of graphics and/or video data. System 100 includes a central processing unit (CPU) 101, a system bus 102, a display controller 103, a frame buffer 104, a digital to analog converter (DAC) 105 and a display device 106. Display controller 103, frame buffer 104 and DAC 105 may be fabricated together on a single integrated circuit chip 107 or on separate chips. Display controller 103 and frame buffer 104 are coupled by an address bus 108 and an associated data bus 109 constructed in accordance with the principles of the present invention.

CPU ("master") 101 controls the overall operation of system 100, determines the content of graphics data to be displayed on display unit 106 under user commands, and performs various data processing functions. CPU 101 may be, for example, a general purpose microprocessor used in commercial personal computers. CPU 101 communicates with the remainder of system 100 via CPU bus 102, which may be, for example, a local bus, an ISA bus or a PCI bus. DAC 105 receives digital data from display controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device which displays images on a display screen as a plurality of pixels. It should also be noted that in alternate embodiments, "display" 106 may be another type of output device such as a laser printer or similar document view/print appliance.

Figure 2:
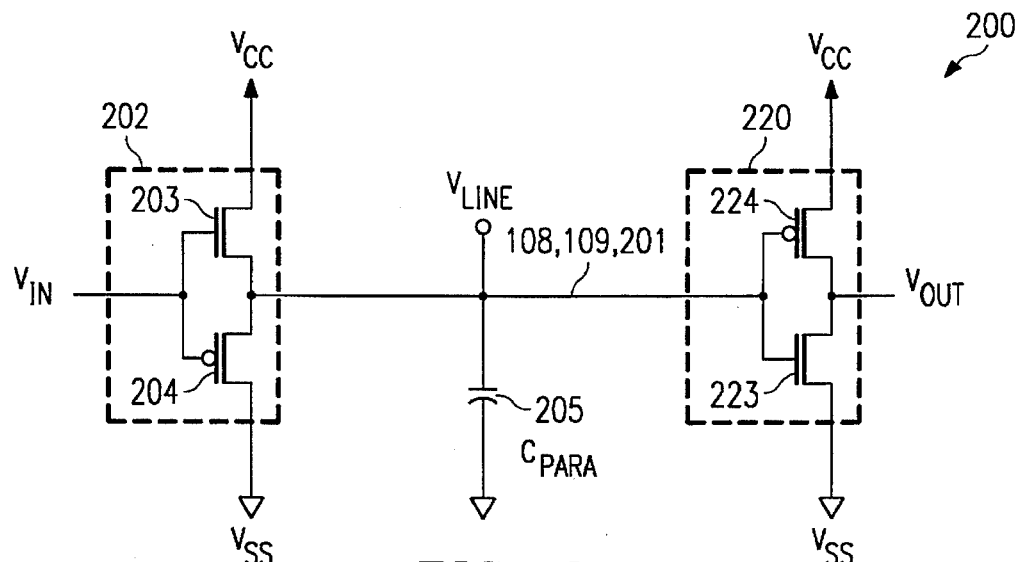
FIG. 2 is an electrical schematic diagram of bus line driver/receiver circuitry embodying the principles of the present invention, the circuitry of FIG. 2 suitable in one application for transferring data across address and data buses coupling the display controller and frame buffer of the system illustrated in FIG. 1.

FIG. 2 is an electrical schematic diagram of bus driver/receiver circuitry 200 for transferring data across a transmission line, such as a given line 201 of address bus 108 or data bus 109. It should be noted that in system 100, driver/receiver circuitry 200 could also be applied to the transfer of data and/or addresses between bus 102 and display controller 103, between display controller 103 and DAC 105, or between DAC 105 and display 106, to name only a few examples. In FIG. 2, selected bus line 201 is assumed to be unidirectional for discussion purposes. Also, for discussion purposes, line driver 202 is shown driving an output load represented by a standard CMOS inverter 220, which is comprised of p-channel transistor 224 and n-channel transistor 223. It should be understood, however, that other output loads may be used. The capacitive loading of bus line 201 is represented by the parasitic capacitance $C_{PARA}$, discussed further below.

In the illustrated embodiment, data is transmitted across bus line 201 using non-inverting line driver 202, which includes p-channel transistor 204 and n-channel transistor 203. Line driver 202 operates between voltage rails of $V_{CC}$ and $V_{SS}$. For a CMOS embodiment, $V_{CC}$ is typically in the range of +3.3 V to +5 V and $V_{SS}$ is typically 0 V. For discussion purposes, it will be assumed that $V_{CC}$ is 3.3 V and $V_{SS}$ is 0 V for the remainder of this disclosure. For most CMOS processes, $|V_{TN}|=|V_{TP}|=20\%-25\%$ of $|V_{CC}-V_{SS}|$ when $V_{CC}=3.3$ V+/−10%. Also for discussion purposes, it will hereafter also be assumed that $V_{TN}$ and $V_{TP}$ are about 0.7 V. It should be understood, however, that such operating parameters and device parameters are merely illustrative and a wide range of other parameter values may be used without departing from the spirit and scope of the present invention.

Figure 3:
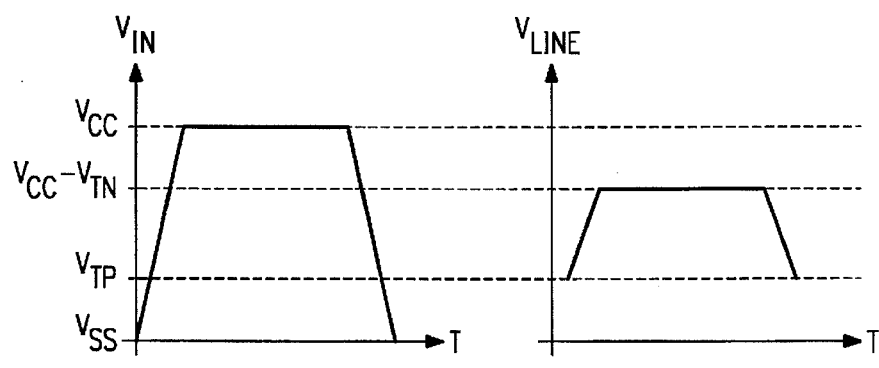
FIG. 3 is a diagram of a typical input voltage waveform and a typical line voltage waveform of the bus line driver circuit illustrated in FIG. 2.

The operation of line driver 202 is best understood by referring to the timing diagram in FIG. 3, in conjunction with FIG. 2. For a standard CMOS gate, such as inverter 220, the peak-peak voltage swing on the output is substantially the same as appears on the input—the input and output voltages both typically swinging approximately between the rail voltages, $V_{CC}=3.3$ V and $V_{SS}=0$ V (ground). This follows from the fact that, in typical CMOS applications, the source of the n-channel device is connected to $V_{SS}$ and the source of the p-channel device is connected to $V_{CC}$.

However, in line driver 202, the drain of the p-channel device is connected to $V_{SS}$(ground), the drain of the n-channel device is connected to $V_{CC}$, and the sources of both devices are coupled to bus line 201. If the gate voltage, $V_{IN}$, of n-channel transistor 203 equals $V_{CC}$, the source of n-channel transistor 203, which is connected to line 201, cannot go any higher than $V_{CC}-V_{TN}$, because at that point, $V_{GSN}$, the gate-to-source voltage of n-channel transistor 203 will be less than the threshold voltage, $V_{TN}$, and n-channel transistor 203 will be cut off (i.e., enter the "pinch-off" operating region). The line voltage, $V_{LINE}$, is therefore clipped at an upper limit of, for example, $V_{CC}-V_{TN}=3.3$ V−0.7 V=2.6 V.

Similarly, $V_{LINE}$ is clipped at a lower limit of 0.7 by p-channel transistor 204, which cuts off (i.e., enter "pinch-off" operating region) when $V_{LINE}$ reaches $V_{SGP}=V_{TP}=0.7$ V. The upper and lower limits of $V_{LINE}$ therefore yield a peak-peak voltage swing of 2.6−0.7=1.9 $V_{p-p}$.

It should be noted that at $V_{OUT}$, the output of inverter 220, the voltage swing will again be between the rail voltages, $V_{CC}=3.3$ V and $V_{SS}=0$ V. The upper limit voltage of 2.6 V is more than sufficient to drive n-channel resistor 223 into saturation and reduce $V_{OUT}$ to 0 V, while the lower limit voltage of 0.7 V is more than sufficient to drive p-channel resistor 224 into saturation and raise $V_{OUT}$ to substantially 3.3 V.

Recalling that the power loss in bus line 201 is given by the equation $P=CV^2f$, where $V=V_{LINE}$, the advantages of the present invention can readily be understood. In the illustrated embodiment, transistors 203 and 204 drive (charge/discharge) a parasitic capacitance, $C_{para}$ (represented by capacitor 205), on bus line 201. Capacitance $C_{para}$ is assumed to have an approximate value of 2 pF for illustrative purposes. The value of $C_{para}$ will vary from physical embodiment to physical embodiment and will depend on such factors as the length and width of the conductor and the spacing from the ground plane. By reducing the value of V in $CV^2f$, the amount of power consumed by the parasitic capacitance of bus line 201 is reduced. In particular, when bus line driver 202 is driving bus line 201 and inverter 220 at a high rate of speed, bus line driver 202 dissipates substantially less power in parasitic capacitor 205 than a typical prior art line driver that swings between 0 V and $V_{CC}=3.3$ V on its output.

Figure 4:
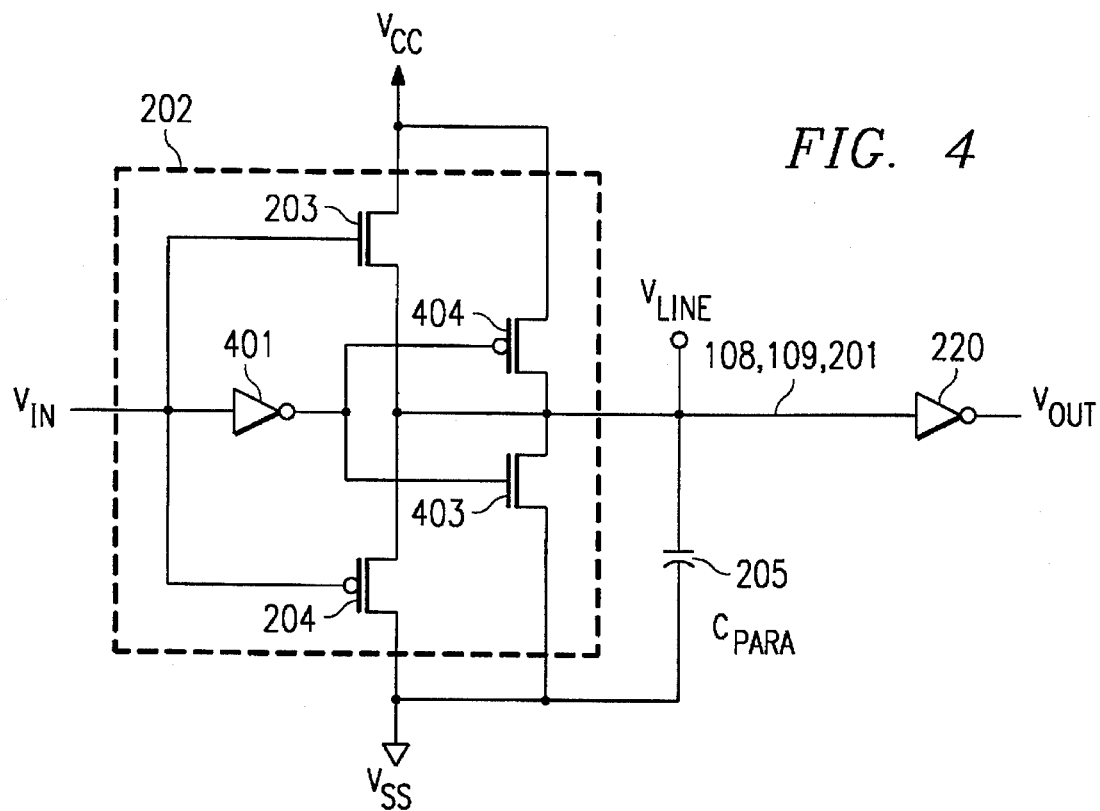
FIG. 4 is an electrical schematic diagram of a second embodiment of the bus line driver circuitry of FIG. 2.

FIG. 4 illustrates an alternate embodiment of the present invention that eliminates steady-state power dissipation in inverter 220. When bus line driver 202 is not transmitting data across bus line 201, small amounts of power will continually be dissipated in inverter 220. This is because the gate voltage, $V_{LINE}$, on n-channel transistor 223 and p-channel 224 is never at the rail voltages $V_{CC}=3.3$ V and $V_{SS}=0$ V. As a result, n-channel transistor 223 does not completely shut off when $V_{LINE}=V_{CC}-V_{TN}$ and p-channel transistor 224 does not completely shut off when $V_{LINE}=V_{TP}$. A small amount of current is therefore dissipated in inverter 220 when $V_{LINE}$ is held statically at either $V_{TP}=0.7$ V or $V_{CC}-V_{TN}=2.6$ V.

In FIG. 4, inverter 401 drives a standard CMOS inverter comprised of p-channel transistor 404 and n-channel transistor 403. Thus, inverter 401 and transistors 404 and 403 together form a non-inverting line driver which has an input ($V_{IN}$) connected to the input of bus line driver 202 (transistors 203 and 204) and an output connected to the output ($V_{LINE}$) of bus line driver 202. Thus, bus line driver 202 operates in parallel with the non-inverting driver. However, transistors 404 and 403 are designed to sink much less current than transistors 203 and 204 of bus line driver 202, typically 2 or 3 orders of magnitude less current. The voltage on bus line 201 will therefore be controlled by bus line driver 202 and the output waveform on $V_{LINE}$ will still resemble FIG. 3 at high speed.

However, when bus line driver 202 is no longer transmitting data across bus line 202 and $V_{LINE}$ is static at either $V_{TP}$ or $V_{CC}-V_{TN}$, the non-inverting line driver is still "on". Therefore, bus line 201 will (eventually) be driven to either $V_{CC}$ or 0 V by the non-inverting line driver and power loss in inverter 220 will drop to zero.

Figure 5:
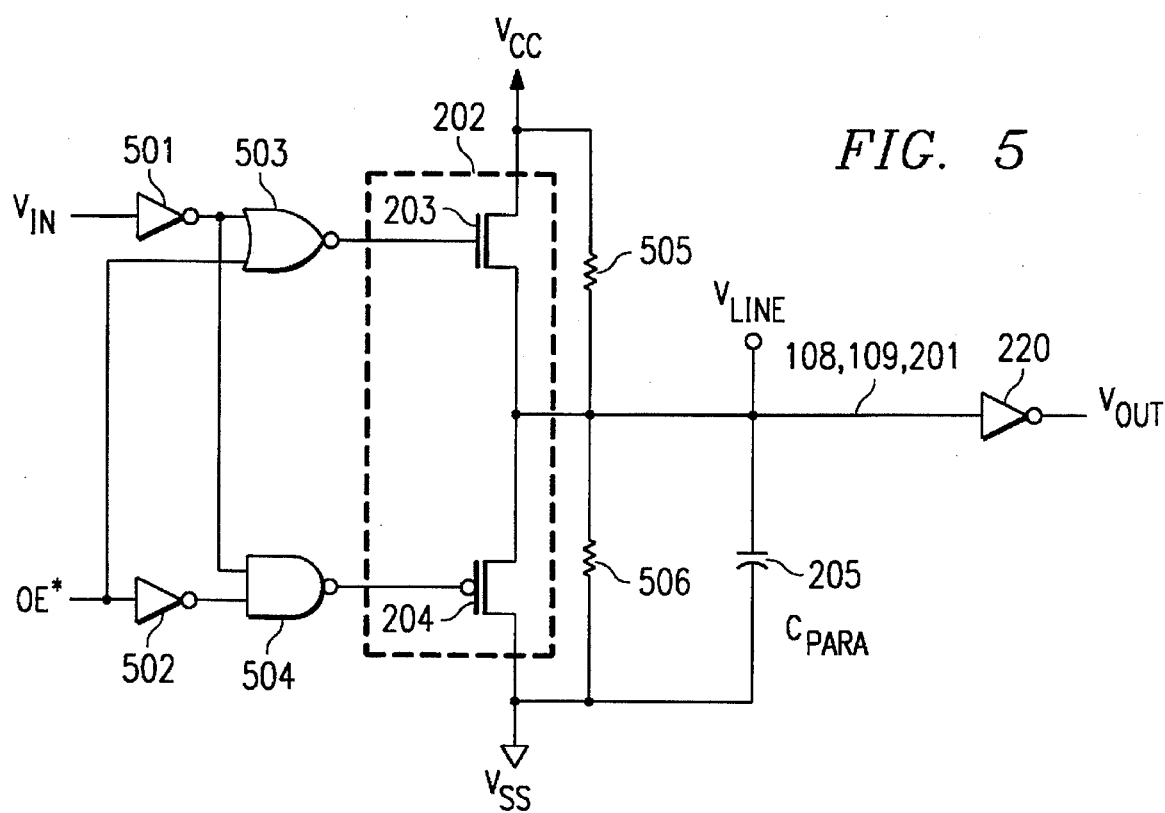
FIG. 5 is an electrical schematic diagram of a third embodiment of the bus line driver circuitry of FIG. 2.

FIG. 5 illustrates an alternate embodiment of the present invention that may be used to hold the voltage on bus line 201 to a predetermined level when $V_{LINE}$ is static and that provides a means for allowing more than one driver circuit to be connected to the same bus. In FIG. 5, the output of bus line driver 202 is connected to $V_{CC}$ by resistor 505 and to ground ($V_{SS}$) by resistor 506. Resistors 505 and 506 typically have very large resistances. The signal $V_{IN}$ is switched to line driver 202 by inverter 501, NAND gate 504 and NOR gate 503. The output enable signal, OE*, is applied to NAND gate 504 (through inverter 502) and NOR gate 503 and is used to enable/disable the output of line driver 202. NAND gate 504, NOR gate 503, inverter 501 and inverter 502 are standard CMOS gates similar to inverter 220 and have output voltage swings between substantially $V_{CC}$ and substantially $V_{SS}$.

OE* is an active low signal that allows $V_{IN}$ to pass through NAND gate 504 and NOR gate 503 to the gates of transistors 203 and 204 whenever OE* is low. When OE* is high, the output of NAND gate 504 is substantially equal to $V_{CC}$ and p-channel transistor 204 is cut off (i.e., in "pinch-off" operating region). Also, when OE* is high, the output of NOR gate 503 is substantially equal to $V_{SS}$ and n-channel transistor 203 is cut off (i.e., in "pinch-off" operating region). With both n-channel transistor 203 and p-channel transistor 204 cut off, the output of line driver 202 is "floating" and the voltage $V_{LINE}$ is determined by the voltage divider ratio between resistors 505 and 506. By proper selection of the values of resistors 505 and 506, bus line 201 may be set to a range of values between $V_{SS}$ and $V_{CC}$.

For example, if resistor 505 and resistor 506 are equal in value, $V_{LINE}$ will be equal to $V_{CC}/2$ whenever OE* is high. This is advantageous in that it allows the output voltage on line driver 202 to turn on faster when OE* is switched to zero and $V_{IN}$ begins to transmit data.

In alternate embodiments, either resistor 505 or resistor 506 may be omitted in order to eliminate steady-state power dissipation in inverter 220. For example, if resistor 505 is omitted in FIG. 5 and OE* is high, thereby disabling the output of line driver 202, resistor 506 will gradually discharge whatever charge is on capacitor 205. Resistor 506 therefore pulls $V_{LINE}$ all the way down to ground potential (i.e., below $V_{TP}=0.7$ V) and there is substantially zero power loss in inverter 220 during steady state conditions on bus line 201.

Similarly, if resistor 506 is omitted in FIG. 5 and OE* is high, thereby disabling the output of line driver 202, resistor 505 will gradually pull bus line 201 and capacitor 205 up to substantially $V_{CC}=3.3$ V (i.e., above $V_{CC}-V_{TN}$). This results in substantially zero power loss in inverter 220 during steady state conditions on bus line 201.

Figure 6:
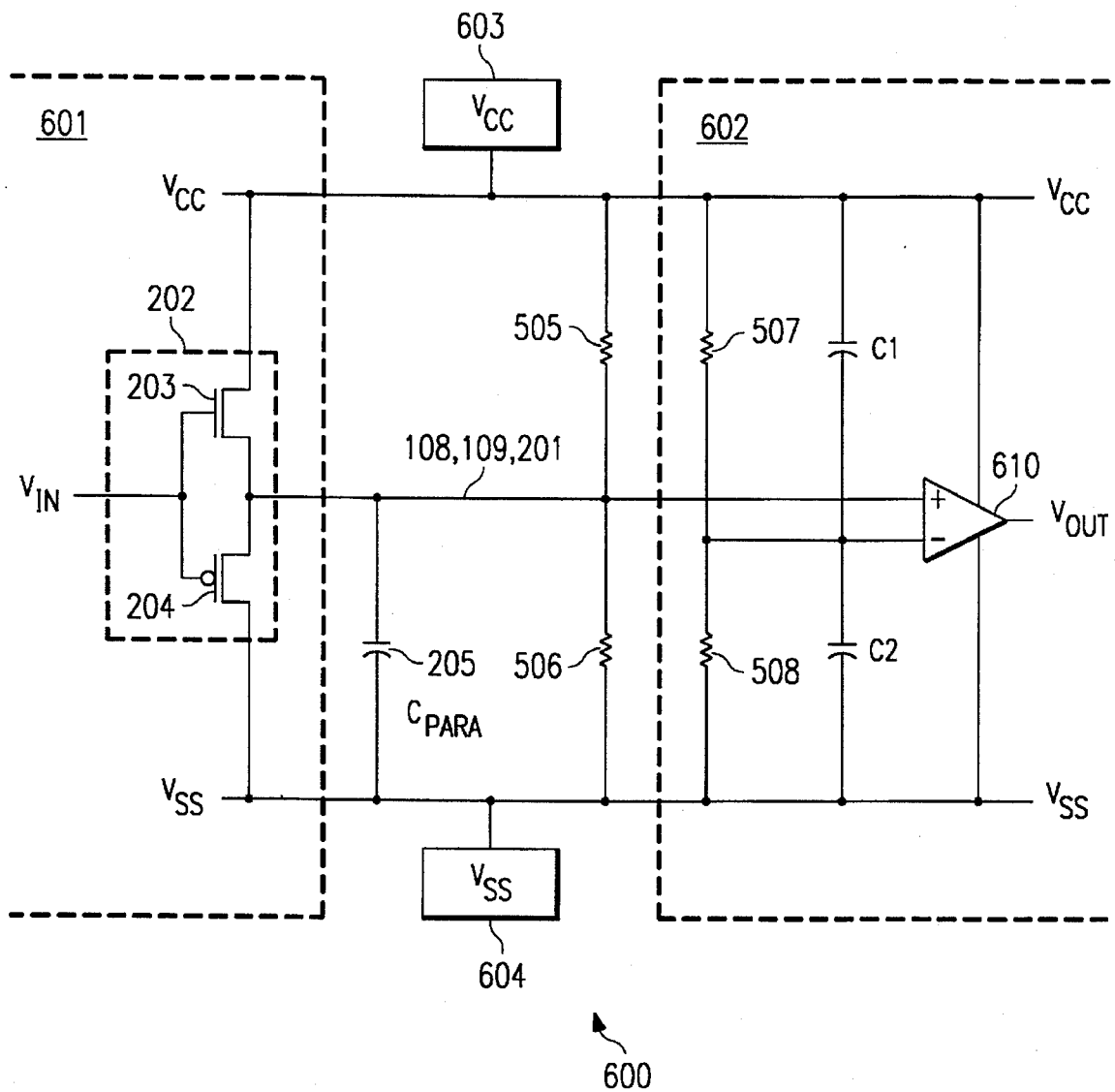
FIG. 6 is an electrical schematic diagram of a fourth embodiment of the bus line driver circuitry of FIG. 2.

FIG. 6 is an alternate embodiment of the present invention that may be used to transfer data from a first integrated circuit (IC) 601 to a second integrated circuit (IC) 602 across bus line 201. Integrated circuit-to-integrated circuit data transfers are being described for exemplary purposes only in the illustrative embodiment. In alternate embodiments of the principles of the present invention, substantially all of the circuits in driver/receiver circuitry 600 may be fabricated on a single chip to implement on-chip transfers. In FIG. 6, bus line 201 is assumed to be unidirectional for discussion purposes. In other embodiments, bus line 201 could be bi-directional.

Processing circuits on IC 601 and IC 602 operate between voltage rails of $V_{CC}$ and $V_{SS}$. IC 601 may, for example, contain the processing circuitry within display controller 103 and IC 602 may contain the input/output circuitry of frame buffer 104. $V_{CC}$ and $V_{SS}$ voltage levels are externally supplied to IC 601 and IC 602 from power supplies 603 and 604, respectively. In the illustrated embodiment, data is transmitted across bus line 201 using line driver 202 at a reduced voltage swing, as previously described in connection with FIGS. 2 and 5.

Bus line 201 is coupled to the non-inverting input of comparator 610 in IC 602. During transmission of data, comparator 610 compares the voltage on bus line 201 with a reference voltage determined by the voltage divider of resistor 507 (R507) and resistor 508 (R508) (i.e., [R508/(R507+R508)]×($V_{CC}-V_{SS}$)). When no data is being transmitted, bus line 201 is "floating" at a DC bias voltage determined by the voltage divider of resistor 505 (R505) and resistor 506 (R506) (i.e., [R506/(R505+R506)]×($V_{CC}-V_{SS}$)). In the illustrative chip-to-chip transmission embodiment, R505 and R506 are resistors on the PC board.

In a preferred embodiment invention, R507=R508 so that the R507–R508 voltage divider reference is about $V_{CC}/2$. R505 and R506 may be omitted, but initial switching speeds are improved when data is first transmitted if R505 and R506 are used to set the DC bias level close to $V_{CC}/2$. R505 and R506 may also be selected to set the DC bias of bus line 201 at some other level, according to system noise and power requirements. If the DC bias of bus line 201 is set below the R507–R508 voltage divider reference, then the signal $V_{OUT}$ is approximately 0 V under DC conditions. If the DC bias of bus line 201 is set above the R507–R508 voltage divider reference, then the signal $V_{OUT}$ is approximately $V_{CC}$ under DC conditions.

Comparator 610 is coupled to the $V_{CC}$ and $V_{SS}$ supply rails so that the output signal, $V_{OUT}$, of comparator 610 is returned to a full voltage swing between $V_{CC}$ and $V_{SS}$. Thus, when the voltage on bus line 201 falls below $V_{CC}/2$, the voltage on the non-inverting input of comparator 610 is less than the reference voltage, $V_{CC}/2$, on the inverting input and the output of comparator 610 goes low to $V_{SS}=0$ V. Similarly, when the voltage on bus line 201 rises above $V_{CC}/2$, the voltage on the non-inverting input of comparator 610 is greater than the reference voltage, $V_{CC}/2$, on the inverting input, and the output of comparator 610 goes high to $V_{CC}$. Capacitor C1 and capacitor C2 are optional filter capacitors that may be used to remove noise from the DC bias reference line.

The driver/receiver circuitry 600 in FIG. 6 comprises a useful bus architecture for connecting multiple chips since it consumes much less power than a TTL or standard CMOS bus and is self-referencing ($V_{CC}$ provides the reference). As noted above, a system designer may adjust the levels of $V_{CC}$ and $V_{SS}$ and select different values of resistors 505 and 506 to account for system noise margins and the reduced voltage swing on bus line 201. In embodiments where resistors 507 and 508 are equal, the reference voltage on comparator 610 is always at the midpoint between $V_{CC}$ and $V_{SS}$. Thus, as the value of $V_{CC}$ is reduced from 5 V or 3.3 V to, for example, 2.2 Volts, the reference will stay at the midpoint between the voltage supplies and also at the midpoint of the reduced voltage swing on bus line 201 (i.e., midpoint between $V_{CC}-V_{TN}$ and $V_{SS}+V_{TP}$).

Although the present invention and its advantages have been described in detail, it should be understood that various changes, substitutions and alterations can be made herein without departing from the spirit and scope of the invention as defined by the appended claims.

What is claimed is:

1. A system for transferring a signal across a line comprising:

first circuitry for transmitting a signal across said line, said first circuitry comprising:
   circuitry for generating a first signal having a first voltage swing between a first high voltage level and a first low voltage level; and
   a line driver for receiving said first signal and outputting a second signal on said line having a second voltage swing between a second high voltage level less than said first high voltage level and a second low voltage level greater than said first low voltage level; and second circuitry for receiving said second signal transmitted at said second voltage swing, said second circuitry comprising a comparator, wherein a first input of said comparator is coupled to said line and a second input of said comparator is coupled to a reference voltage greater than said second low voltage level and less than said second high voltage level, said comparator outputting a third signal at substantially said first voltage swing.

2. The system as set forth in claim 1 wherein said line driver comprises:

a p-channel transistor having a drain coupled to a low voltage rail, a source coupled to said line, and a gate for receiving said first signal; and an n-channel transistor having a drain coupled to a high voltage rail, a source coupled to said line, and a gate for receiving said first signal.

3. The system as set forth in claim 2 wherein said second input of said comparator is coupled to a first resistor having a first terminal coupled to said second input of said comparator and a second terminal coupled to said high voltage rail and a second resistor having a first terminal coupled to said second input and a second terminal coupled to said low voltage rail, wherein a voltage divider of said first and second resistors determines said reference voltage.

4. The system as set forth in claim 1 further comprising circuitry for disabling an output of said line driver coupled to said line, said circuitry for disabling applying substantially said first high voltage level to said gate of said p-channel transistor to thereby turn off said p-channel transistor and applying substantially said first low voltage level to said gate of said n-channel transistor to thereby turn off said n-channel transistor.

5. The system as set forth in claim 4 further comprising a first resistor having a first terminal coupled to said line and a second terminal coupled to a high voltage rail.

6. The system as set forth in claim 5 further comprising a second resistor having a first terminal coupled to said line and a second terminal coupled to a low voltage rail.

7. The system as set forth in claim 1 further comprising a first resistor having a first terminal coupled to said line and a second terminal coupled to a high voltage rail and a second resistor having a first terminal coupled to said line and a second terminal coupled to a low voltage rail.

8. The system of claim 1 wherein said line comprises one of a plurality of data lines forming a bus.

9. The system of claim 1 wherein said first circuitry and said second circuitry are disposed on separate integrated circuit chips.

10. An integrated circuit, at least some circuitry forming said integrated circuit operating between a preselected supply voltage and a low voltage rail, comprising:

a first block of processing circuitry;

a second block of processing circuitry;

a bus having a line for transferring signals between said blocks of processing circuitry;

a line driver for transmitting signals across said line, said line driver receiving an input signal with a first voltage swing between a first high voltage level substantially equal to said preselected supply voltage and a first low voltage level substantially equal to said low voltage rail and driving said line with a second voltage swing between a second high voltage level less than said first high voltage level and a second low voltage level greater than said first low voltage level; and a comparator for receiving said second signal transmitted at said second voltage swing, wherein a first input of said comparator is coupled to said line and a second input of said comparator is coupled to a reference voltage greater than said second low voltage level and less than said second high voltage level, said comparator outputting a third signal at substantially said first voltage swing.

11. The integrated circuit as set forth in claim 10 wherein said line driver comprises:

a p-channel transistor having a drain coupled to said low voltage rail, a source coupled to said line, and a gate for receiving said input signal; and an n-channel transistor having a drain coupled to said preselected supply voltage, a source coupled to said line, and a gate for receiving said input signal.

12. The integrated circuit as set forth in claim 11 wherein said second input of said comparator is coupled to a first resistor having a first terminal coupled to said second input of said comparator and a second terminal coupled to said preselected supply voltage and a second resistor having a first terminal coupled to said second input and a second terminal coupled to said low voltage rail, wherein a voltage divider of said first and second resistors determines said reference voltage.

13. The integrated circuit as set forth in claim 11 further comprising circuitry for disabling an output of said line driver coupled to said line, said circuitry for disabling applying substantially said first high voltage level to said gate of said p-channel transistor to thereby turn off said p-channel transistor and applying substantially said first low voltage level to said gate of said n-channel transistor to thereby turn off said n-channel transistor.

14. The integrated circuit as set forth in claim 13 further comprising a first resistor having a first terminal coupled to said line and a second terminal coupled to said preselected supply voltage.

15. The integrated circuit as set forth in claim 13 further comprising a first resistor having a first terminal coupled to said line and a second terminal coupled to said low voltage rail.

16. The integrated circuit as set forth in claim 13 further comprising a first resistor having a first terminal coupled to said line and a second terminal coupled to said preselected supply voltage and a second resistor having a first terminal coupled to said line and a second terminal coupled to said low voltage rail.

17. The integrated circuit as set forth in claim 11 further including a second line driver having an input coupled to said p-channel transistor gate and said n-channel transistor gate and an output coupled to said line, said second line driver operable to drive said line from said second high voltage level to said first high voltage level when said input signal is held statically at said first high voltage level and to drive said line from said second low voltage level to said first low voltage level when said input signal is held statically at said first low voltage level.

18. The integrated circuit as set forth in claim 10 wherein said line comprises a data line and said signals comprise data signals.

19. The integrated circuit as set forth in claim 10 wherein said line comprises an address line and said signals comprise address signals.

20. A method of transferring data across a data line from a line driver to a receiver comprising the steps of:

receiving data on an input of the line driver, the data having a voltage swing between a first logic high state and a first logic low state;

driving the data line coupled to the output of the line driver at a second logic high state less than the first logic high state and at second logic low state greater than the first logic low state;

receiving data at the second logic high state and at the second logic low state from the data line at an input of the receiver;

comparing the received data to a reference voltage;

outputting the data from the receiver at the first logic high state when the voltage on the data line is greater than the reference voltage and at the first logic low state when the voltage on the data line is less than the reference voltage.

21. The method as set forth in claim 20 wherein the step of comparing is performed by a comparator having a non-inverting input coupled to said data line and an inverting input coupled to said reference voltage.

* * * * *